(12) United States Patent
Etschmaier et al.

(10) Patent No.: US 12,527,139 B2
(45) Date of Patent: Jan. 13, 2026

(54) OPTOELECTRONIC MODULE

(71) Applicant: ams-OSRAM Asia Pacific Pte. Ltd., Singapore (SG)

(72) Inventors: Harald Etschmaier, Graz (AT); Gerhard Peharz, Gleisdorf (AT); Martin Faccinelli, Graz (AT)

(73) Assignee: ams-OSRAM Asia Pacific Pte. Ltd., Singapore (SG)

( * ) Notice: Subject to any disclaimer, the term of this patent is extended or adjusted under 35 U.S.C. 154(b) by 354 days.

(21) Appl. No.: 18/276,730

(22) PCT Filed: Dec. 21, 2021

(86) PCT No.: PCT/SG2021/050814
§ 371 (c)(1),
(2) Date: Aug. 10, 2023

(87) PCT Pub. No.: WO2022/173368
PCT Pub. Date: Aug. 18, 2022

(65) Prior Publication Data
US 2024/0136486 A1 Apr. 25, 2024
US 2024/0234659 A9 Jul. 11, 2024

(30) Foreign Application Priority Data

Feb. 12, 2021 (GB) .................... 2102019

(51) Int. Cl.
*H10H 20/857* (2025.01)
*G01R 31/26* (2020.01)
(Continued)

(52) U.S. Cl.
CPC ....... *H10H 20/857* (2025.01); *G01R 31/2635* (2013.01); *H10H 20/8506* (2025.01); *H10H 20/852* (2025.01); *H10H 20/855* (2025.01)

(58) Field of Classification Search
CPC ............... H10H 20/857; H10H 20/855; H10H 20/8506; H10H 29/857; H10H 29/855;
(Continued)

(56) References Cited

U.S. PATENT DOCUMENTS

| 8,441,086 B2 | 5/2013 | Tu et al. |
| 10,204,945 B2 | 2/2019 | Rudmann et al. |

(Continued)

FOREIGN PATENT DOCUMENTS

| CN | 111564546 A | * 8/2020 | ........... H10H 20/857 |
| EP | 1 080 683 A2 | 3/2001 | |

(Continued)

OTHER PUBLICATIONS

Korean office action issued for the corresponding Korean patent application No. 10-2023-7028304, dated Jan. 8, 2025, 7 pages (for informational purposes only).

(Continued)

*Primary Examiner* — Antonio B Crite
(74) *Attorney, Agent, or Firm* — Vierig, Jentschura & Partner mbB

(57) ABSTRACT

An optoelectronic module includes a driver die mounted on a substrate, an optical emitter mounted to an upper surface of the driver die, a spacer mounted to the upper surface of the driver die, and an optical element mounted to an upper surface of the spacer. The spacer encloses and defines a cavity around the optical emitter. The optical element is transparent to light emitted by the optical emitter and includes an interlock feature electrically connected to the driver die.

20 Claims, 7 Drawing Sheets

(51) Int. Cl.
    *H01L 25/16*     (2023.01)
    *H01S 5/183*     (2006.01)
    *H10H 20/85*     (2025.01)
    *H10H 20/852*     (2025.01)
    *H10H 20/855*     (2025.01)
    *H10H 29/24*     (2025.01)
    *H10H 29/85*     (2025.01)
    *H10H 29/852*     (2025.01)
    *H10H 29/855*     (2025.01)

(58) Field of Classification Search
    CPC . H10H 29/8506; H01S 5/022; H01S 5/02345; H01S 5/02355; H01S 5/183; H01L 25/167; H01L 25/0756
    See application file for complete search history.

(56) References Cited

U.S. PATENT DOCUMENTS

| | | | |
|---|---|---|---|
| 10,243,111 | B2 | 3/2019 | Rudmann et al. |
| 10,667,341 | B1 | 5/2020 | Kriman et al. |
| 2005/0096587 | A1 | 5/2005 | Santini et al. |
| 2020/0135626 | A1 | 4/2020 | Yong et al. |
| 2020/0153197 | A1 | 5/2020 | Chen et al. |
| 2020/0278426 | A1* | 9/2020 | Dummer ............ H01S 5/06203 |

FOREIGN PATENT DOCUMENTS

| | | |
|---|---|---|
| JP | 2003109525 A | 4/2003 |
| KR | 10-20010067120 A | 7/2001 |
| KR | 10-2011-0052522 A | 5/2011 |
| WO | 2019/152462 A1 | 8/2019 |
| WO | 2019/236005 A1 | 12/2019 |
| WO | 2020/038066 A1 | 2/2020 |
| WO | 2020/122815 A1 | 6/2020 |
| WO | 2020/263184 A1 | 12/2020 |

OTHER PUBLICATIONS

International Search Report issued for corresponding International Patent Application No. PCT/SG2021/050814 on Mar. 29, 2022 (4 pages).
Written Opinion issued for corresponding International Patent Application No. PCT/SG2021/050814 on Mar. 29, 2022 (5 pages).
Search Report issued for corresponding Great Britain Patent Application No. GB2102019.3 on Aug. 5, 2021 (4 bages).

* cited by examiner

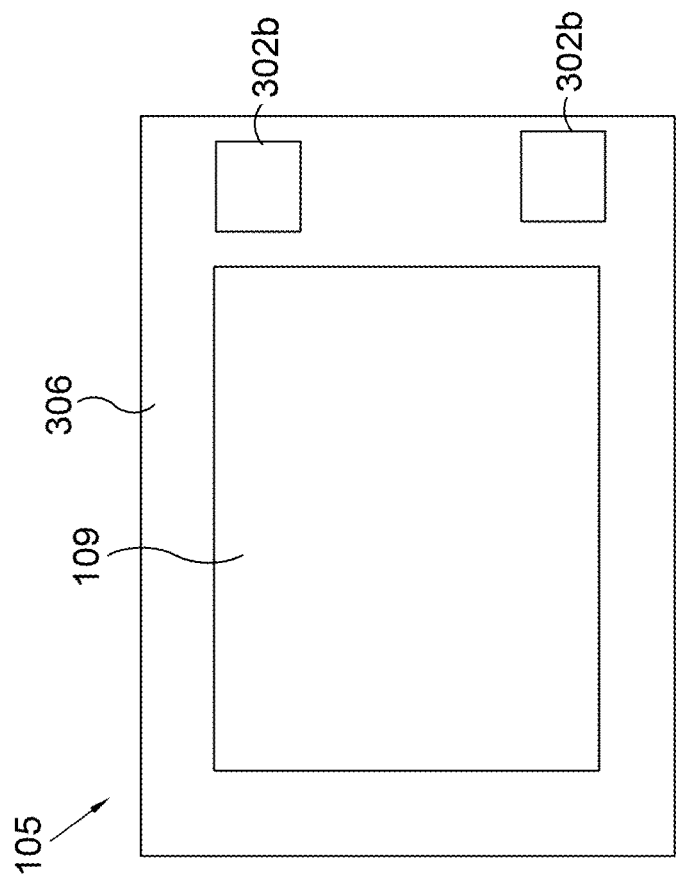
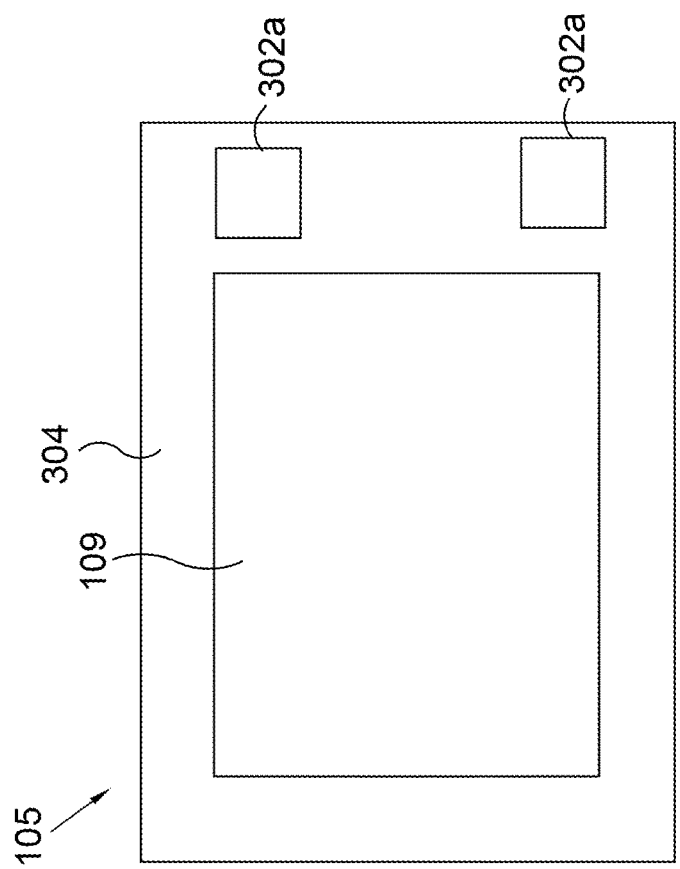

OPTOELECTRONIC MODULE

CROSS REFERENCE TO RELATED APPLICATION

This application is a National Stage of International Application No. PCT/SG2021/050814, filed on Dec. 21, 2021, which designates the United States and was published in English, and which claims priority to Great Britain Patent Application No. 2102019.3, filed on Feb. 12, 2021, in the Intellectual Property Office. All of the aforementioned applications are hereby incorporated by reference in their entireties.

TECHNICAL FIELD

This disclosure relates to an optoelectronic module having an optical emitter.

BACKGROUND

Mobile communications devices, such as smart phones, tablets, laptop computers, and other portable computing devices, can include technologies to record three-dimensional images, sense motion and/or gestures. Digital recording methods use various types of miniature optoelectronic modules, which interact with cameras to record dynamical events in three-dimensional regions. These optoelectronic modules can be of various forms and deliver different types of functions. Some illuminate a wide area with very short pulses for Light Detection and Ranging (LIDAR) type measurements recording time of flight information. Others are pulsed or continuous wave (CW), and project structured light patterns onto a scene. A digital camera records an image of the structured light pattern, and software algorithms are used to determine three-dimensional scene information from modifications in the patterned image.

Optoelectronic modules may include one or more devices for emission of visible and/or invisible radiation, such as a light-emitting diode, or a laser, such as a vertical cavity surface emitting laser (VCSEL) device. Various optical components (e.g., an optical diffuser and/or a microlens array) can be placed in the beam path to modify the beam properties for the specific application.

The optical output power of a bare radiation-emitting device can, in some cases, be so high that it may cause damage to a person's eye or skin in the event that the quality of the optical component is compromised. Thus, it is important to ensure that high power radiation-emitting devices meet laser safety regulations when operated in a mobile communications device. For example, the optoelectronic module may be part of an assembly that, under normal operating conditions, maintains eye-safe operation by preventing a person from getting too close to the optoelectronic module. However, in some cases, damage (e.g., cracks) to the optical component(s) that modifies the output beam for safe operation, or the presence of moisture or chemical contamination on the optical component(s), may result in safety hazards. Likewise, if the optical component(s) were to fall off or be removed, safety could be compromised.

SUMMARY

Optoelectronic modules need to have reliable fault detection functionality for the case of malfunction of the optical component(s). The inventors have identified that known methods to incorporate such fault detection functionality significantly increase the complexity and size of the optoelectronic module.

According to one aspect of the present disclosure there is provided an optoelectronic module comprising: a driver die mounted on a substrate; an optical emitter mounted to an upper surface of the driver die; a spacer mounted to the upper surface of the driver die, the spacer enclosing and defining a cavity around the optical emitter; and an optical element (111) mounted to an upper surface of the spacer, the optical element transparent to light emitted by the optical emitter and comprising an interlock feature (113) electrically connected to the driver die. The substrate may be a printed circuit board (PCB), a laminate substrate, a lead-frame substrate or the like.

The foot-print of the optoelectronic module is substantially lower than known optoelectronic modules. This is achieved by a highly integrated package concept where the components are stacked on the driver die.

The robustness and reliability of known optoelectronic modules is typically limited by the optical components (e.g. lenses). In particular when using thermoplastic materials (injection molded lenses) the maximum temperature is limited and standard reflow processes (SMT mounting) cannot be applied. In embodiments, components of the optical stack are made from materials that are able to withstand high temperatures such that the optoelectronic module can assembled on a PCB with other components of a device by standard surface mount technology (SMT) processes. For example a reflow soldering process can be used to mount the optoelectronic module when reflow stable components for the optical stack are used.

The optoelectronic may further comprise an encapsulant material that laterally encapsulates the optical element and the spacer. The driver die may be electrically connected to the substrate via one or more wire bonds and the encapsulant material may encapsulate the one or more wire bonds. Preferably, the encapsulant material covers an upper surface of a portion of the substrate. Preferably, the encapsulant material laterally encapsulates the driver die and covers a portion of the upper surface of the driver die.

The optoelectronic module of the present disclosure provides high reliability which is achieved by a number of contributing factors including the protective sealing of the encapsulant material, the minimal number of parts being used and the solderability of the components. Furthermore the encapsulant material is highly compliant to the encapsulated components which advantageously minimizes the thermal-mechanical stress on the components and wire bonds overcoming CTE (coefficient of thermal expansion) mismatch.

The optoelectronic module may further comprising conductive traces supported by the spacer to make an electrical connection between the driver die and the interlock feature.

The conductive traces may extend through a wall of the spacer, and the spacer may be mounted to the upper surface of the driver die using a first conductive adhesive layer (107a), and the optical element may be mounted to an upper surface of the spacer using a second conductive adhesive layer (107b).

In some implementations, the conductive traces extend from a first set of contact pads to a second set of contact pads through the walls of the spacer, the first set of contact pads in connection with the first conductive adhesive layer and the second set of contact pads in connection with the second conductive adhesive layer.

In some implementations, an upper surface of the driver die comprises driver die contact pads, wherein the first conductive adhesive layer comprises an isotropic conductive adhesive that is between the driver die contact pads and the first set of contact pads of the spacer; and a non-conductive adhesive that is between portions of the upper surface of the driver die surrounding the driver die contact pads and portions of a lower surface of the spacer surrounding the first set of contact pads.

The manufacturing process can be simplified by using an anisotropic conductive adhesive as the first conductive adhesive layer. In particular, in some implementations the upper surface of the driver die comprises driver die contact pads, wherein the first conductive adhesive layer comprises an anisotropic conductive adhesive that is between (i) the driver die contact pads and the first set of contact pads of the spacer; and (ii) portions of the upper surface of the driver die surrounding the driver die contact pads and portions of a lower surface of the spacer surrounding the first set of contact pads.

In some implementations, the second conductive adhesive layer comprises an isotropic conductive adhesive that is between the second set of contact pads of the spacer and contact pads of the interlock feature; and a non-conductive adhesive that is between portions of an upper surface of the spacer surrounding the second set of contact pads and portions of a lower surface of the optical element surrounding the contact pads of the interlock feature.

The manufacturing process can be simplified by using an anisotropic conductive adhesive as the second conductive adhesive layer. In particular, in some implementations the second conductive adhesive layer comprises an anisotropic conductive adhesive that is between (i) the second set of contact pads of the spacer and contact pads of the interlock feature; and (ii) portions of an upper surface of the spacer surrounding the second set of contact pads and portions of a lower surface of the optical element surrounding the contact pads of the interlock feature.

The optical emitter may comprise a vertical cavity surface emitting laser.

The optical emitter may be electrically connected to the driver die via one or more further wire bonds.

The optical element may comprise a diffuser. The optical element may comprise a micro lens array. In particular, the optical element may comprise a substrate with a lower surface with one or more lenses formed thereon. The substrate may be made of glass. The one or more lenses may be made of a resin such as epoxy resin or other polymer material.

The driver die may comprise fault detection circuitry configured to monitor an electrical parameter associated with the interlock feature. The interlock feature may be disposed on a surface of the optical element. The driver die may comprise at least one optical detector coupled to the fault detection circuitry. In these implementations, the optical detector(s) are arranged to measure light reflected by the optical detector and the fault detection circuitry is configured to detect a fault in the optical element by detecting a change in the reflected light.

The interlock feature may comprise a conductive track extending between contact pads of the interlock feature.

The optoelectronic module may further comprise an optical sensor die mounted on an upper surface of the driver die, the optical sensor die comprising at least one optical detector.

According to another aspect of the present disclosure there is provided a computing device comprising the optoelectronic module described herein.

According to another aspect of the present disclosure there is provided a method of manufacturing an optoelectronic module, the method comprising: mounting a driver die on a substrate; mounting an optical emitter to an upper surface of the driver die; mounting a spacer to the upper surface of the driver die, the spacer enclosing and defining a cavity around the optical emitter; and mounting an optical element to an upper surface of the, the optical element transparent to light emitted by the optical emitter and comprising an interlock feature for electrical connection to the driver die.

The method may further comprise laterally encapsulating the optical element and the spacer with an encapsulant material.

These and other aspects will be apparent from the embodiments described in the following. The scope of the present disclosure is not intended to be limited by this summary nor to implementations that necessarily solve any or all of the disadvantages noted.

BRIEF DESCRIPTION OF THE PREFERRED EMBODIMENTS

Some embodiments of the disclosure will now be described by way of example only and with reference to the accompanying figures, in which:

FIG. 3a shows a bottom view of a spacer according to an embodiment of the present disclosure;

FIG. 3b shows a top view of a spacer according to an embodiment of the present disclosure;

DETAILED DESCRIPTION OF THE PREFERRED EMBODIMENTS

Embodiments will now be described by way of example only with reference to the accompanying figures.

Figure 1:
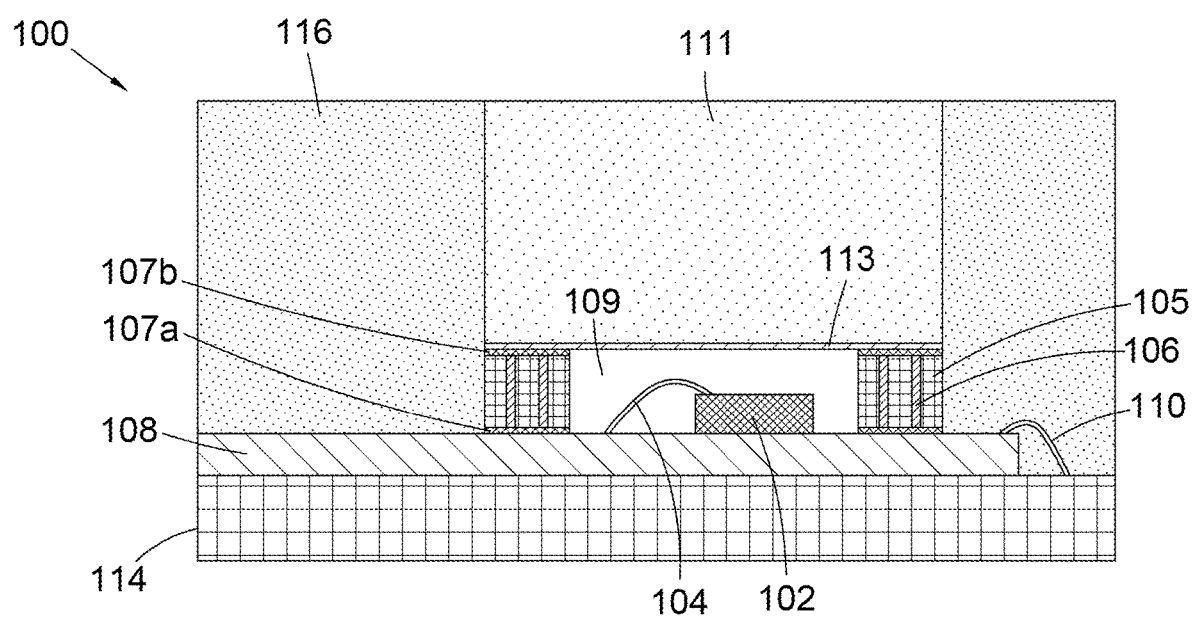
FIG. 1 illustrates an example optoelectronic module according to the present disclosure.

FIG. 1 illustrates an example optoelectronic module 100 in accordance with embodiments of the present disclosure.

As shown in FIG. 1, the optoelectronic module 100 comprises a substrate 114 on which a driver die (e.g., a semiconductor chip such as an application-specific integrated circuit) 108 is mounted. The driver die 108 may be a high voltage ASIC providing a typical output voltage of 15V, comparatively higher than a typical supply voltage of 4V in consumer electronics. The substrate 114 may be a printed circuit board (PCB), a laminate substrate, a lead-frame substrate or the like. The backside of the substrate 114 can include SMT or other contacts for mounting the optoelectronic module 100, for example, to a printed circuit board.

Various different methods for mounting the driver die 108 to the substrate 114 may be used. The driver die 108 may be mounted to the substrate 114 by gluing (e.g. using a die attach film or a liquid adhesive) or soldering.

Electrical connections such as wire bonds 110 and/or contact pads on the backside of the driver die 108 can be provided to couple the driver die 108 to contact pads on the substrate 114.

The optoelectronic module 100 further comprises an optical emitter 102. The optical emitter 102 may comprise one or more light emitting diodes (LEDs), lasers, or other devices. In some embodiments, the optical emitter 102 comprises one or more vertical-cavity surface-emitting lasers (VCSELs). The optical emitter 102 may be configured to emit visible light and/or invisible radiation, such as infrared or near-infrared radiation.

The optical emitter 102 is mounted to the upper surface of the driver die 108. Various different methods for mounting the optical emitter 102 to the driver die 108 may be used. The optical emitter 102 may be mounted to the driver die 108 by gluing with a conductive adhesive or soldering.

Electrical connections such as wire bonds 104 and/or contact pads on the backside of the optical emitter 102 can be provided to couple the optical emitter 102 to contact pads on the driver die 108.

A spacer 105 is mounted to the upper surface of the driver die 108 using a first adhesive layer 107a. That is, the first adhesive layer 107a adheres a lower surface of the spacer 105 to the upper surface of the driver die 108. The spacer 105 encloses the optical emitter 102. The spacer 105 forms a cavity 109 filled with air.

An optical element 111 is mounted to the spacer 105 using a second adhesive layer 107b. That is, the second adhesive layer 107b adheres a lower surface of the optical element 111 to the spacer 105.

The optical element 111 is transmissive of wavelengths of light emitted by the optical emitter 102.

In some implementations, the optical element 111 comprises a transparent substrate coupled to an optical component. The transparent substrate preferably comprises glass. However, other materials are suitable, for example plastic. In some embodiments, the substrate can comprise $SiO_2$ or "display" glass, such as Schott D263T-ECO or Borofloat 33, Dow-Corning Eagle 2000. The optical component may extend into the cavity 109. The optical component may comprise one or more lenses, a micro lens array and/or a diffuser. The optical component may be made of an epoxy molding compound, for example an epoxy resin.

The optical element 111 comprises an interlock feature 113. The interlock feature 113 may be disposed on a lower surface of the optical element 111. That is, the interlock feature 113 may be disposed on a surface of the optical component. In an alternative example, the interlock feature 113 may be at least partially encapsulated inside the transparent substrate. In an alternative example, the interlock feature 113 may be positioned between the transparent substrate and the optical component The interlock feature 113 may comprise, for example, indium tin oxide, chromium oxide, or any other suitable electrically conductive material. The interlock feature is electrical connected to the driver die 108 by way of conductive traces 106.

The conductive traces 106 are supported by the spacer 105. As shown in FIG. 1, the conductive traces 106 may extend through a wall of the spacer 105.

As shown in FIG. 1, an encapsulant material 116 laterally encapsulates the spacer 105 and the optical element 111. That is, the encapsulant material 116 covers the outer sidewalls of the spacer 105 and the optical element 111.

In the example shown in FIG. 1, the encapsulant material 116 may encapsulate the wire bonds 110 which couple the driver die 108 to contact pads on the substrate 114. The encapsulant material 116 may covers portions of the upper surface of the driver die 108 which are not enclosed by the spacer 105. The encapsulant material 116 may laterally encapsulate the driver die 108 (e.g. cover sidewalls of the driver die 108). The encapsulant material 116 may cover portions of the substrate 114 which are not in contact with the driver die 108.

The encapsulant material 116 may be an epoxy molding compound, for example an epoxy resin such as a black epoxy resin, or other polymer material.

The encapsulant material 116 may be applied by a film assisted transfer molding (FAM) process after which the encapsulant material 116 is cured.

The optoelectronic module 100 optionally further comprises an optical sensor die (e.g., a semiconductor chip such as an application-specific integrated circuit) mounted to an upper surface of the driver die 108. The optical sensor die is separated from the spacer 105 and the optical element 111 by the encapsulant material 116. Various different methods for mounting the optical sensor die to the driver die 108 may be used. The optical sensor die may be mounted to the driver die 108 by gluing (e.g. using a die attach film or a liquid adhesive) or soldering. The optical sensor die may be a time-of-flight optical sensor die, however embodiments of the present disclosure are not limited to this example.

Electrical connections such as wire bonds and/or contact pads on the backside of the optical sensor die can be provided to couple the optical sensor die to contact pads on the driver die 108.

The optical sensor die comprises one or more optical detectors. The optical detectors are photosensitive elements each of which is operable to produce a signal in response to a received dose of radiation (for example visible or infrared light). That is, the optical detectors convert received radiation (for example visible or infrared) into electrical signals. The optical detectors may be based on an active-pixel sensor technology and may comprise, for example, an array of complimentary metal-oxide semiconductor (CMOS) pixels.

The optical detectors are arranged such that light incident on an upper surface of the optical sensor die is incident on the optical detectors.

In these embodiments, the encapsulant material 116 is intransparent to the relevant optical wavelengths emitted by the optical emitter 102 and forms an optical barrier between the optical emitter 102 and the optical detectors of the optical sensor die thereby minimizing optical cross-talk i.e. direct transmission of light from the optical emitter 102 to the optical sensor die.

In some embodiments, each of the components of the optoelectronic module 100 are made from a reflow-stable material i.e., a thermally stable material whose transmissivity remains substantially constant even when subjected to relatively high operating temperatures (e.g., temperatures above 260° C. for stability of the shape of a lens).

Figure 2:
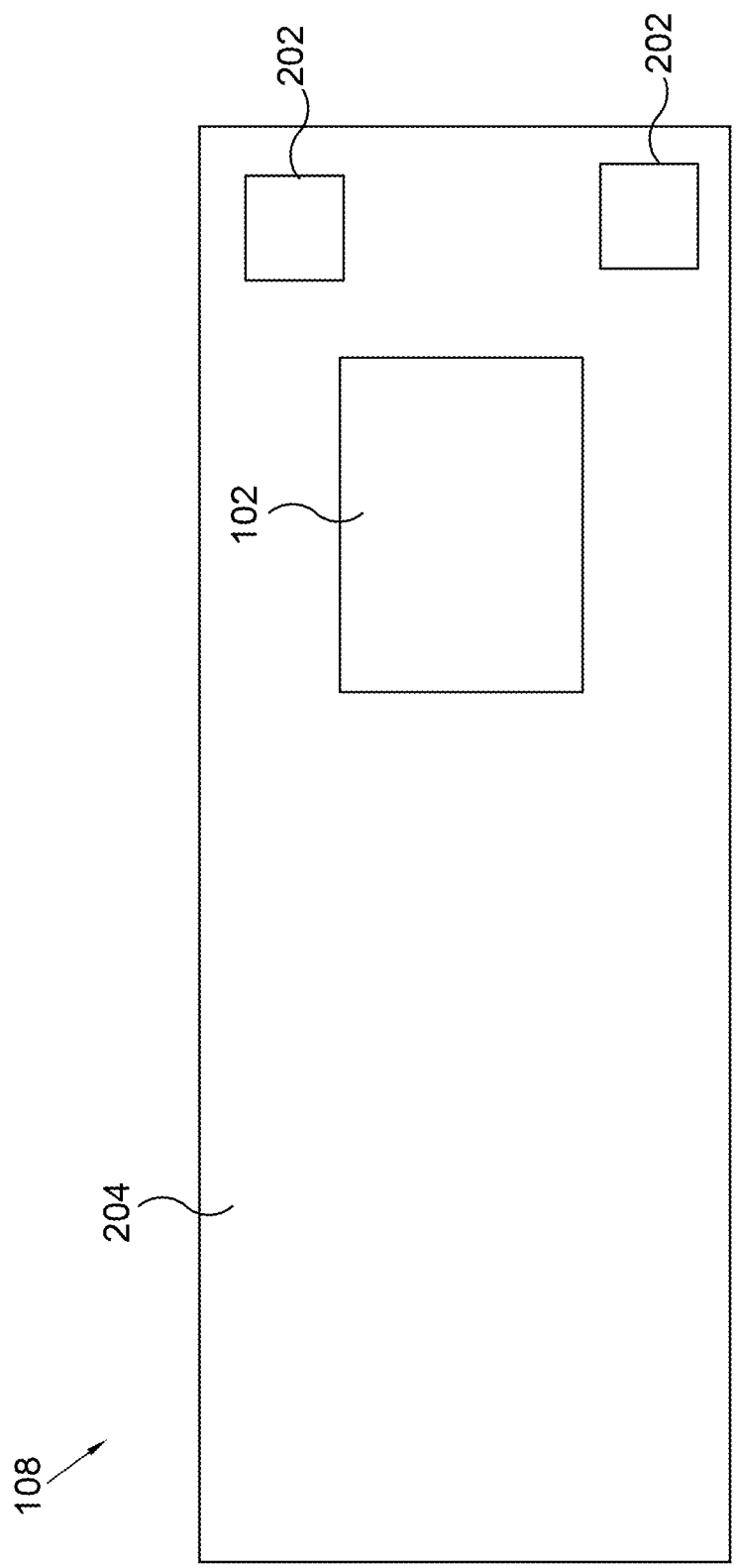
FIG. 2 shows a top view of a driver die according to an embodiment of the present disclosure.

FIG. 2 shows a top view of the driver die 108. FIG. 2 illustrates the optical emitter 102 mounted to the upper surface 204 of the driver die 108. FIG. 2 also shows contact pads 202 on the upper surface 204 of the driver die 108. The contact pads 202 enable the driver die 108 to electrically connect to the interlock feature 113 via the conductive traces 106 of the spacer 105.

As noted above, the conductive traces 106 may extend through a wall of the spacer 105. This is illustrated in FIGS. 3a and 3b.

FIG. 3a is a bottom view of the spacer 105 with conductive traces 106 extending through a wall of the spacer 105.

As shown in FIG. 3a, the conductive traces 106 extend through a wall of the spacer 105 to a lower surface 304 of the spacer. It is the lower surface 304 of the spacer 105 that is adhered to the upper surface of the driver die 108 using the first adhesive layer 107a. In this embodiment, when the spacer 105 is mounted to the upper surface 204 of the driver die 108, contact pads 302a of the conductive traces 106 at the lower surface 304 of the spacer 105 make contact with the contact pads 202 on the upper surface 204 of the driver die 108. It will be appreciated that the contact pads 302a of the conductive traces 106 may simply be the ends of the conductive traces 106.

The first adhesive layer 107a may comprise an anisotropic conductive adhesive which conducts in the vertical (z-direction) only. Use of the anisotropic conductive adhesive as the first adhesive layer 107a enables an electrical connection to be made between the contact pads 202 on the upper surface 204 of the driver die 108 and the contact pads 302a of the conductive traces 106 at the lower surface 304 of the spacer 105 that are vertically above, and in contact with, the contact pads 202.

Due to the fact that the anisotropic conductive adhesive conducts in the vertical (z-direction) only, it can be applied such that it is in contact with the entire lower surface 304 of the spacer 105 and no electrical shorting between the driver die contact pads 202 will occur. That is, the anisotropic conductive adhesive may be applied between (i) the driver die contact pads 202 and the contact pads 302a of the spacer; and (ii) portions of the upper surface 204 of the driver die 108 surrounding the driver die contact pads 202 and portions of a lower surface 304 of the space 105 surrounding the contact pads 302a of the conductive traces 106.

In other embodiments, the first adhesive layer 107a may comprise an isotropic conductive adhesive which conducts in all directions. In order to prevent electrical shorting between the driver die contact pads 202, the isotropic conductive adhesive is only applied between the driver die contact pads 202 and the contact pads 302a of the conductive traces 106.

The isotropic conductive adhesive enables an electrical connection to be made between the contact pads 202 on the upper surface 204 of the driver die 108 and the contact pads 302a of the conductive traces 106 at the lower surface 304 of the spacer 105 that are vertically above, and in contact with, the contact pads 202. In these embodiments, a non-conductive adhesive may be used for the remaining areas between the upper surface 204 of the driver die 108 and the lower surface 304 of the spacer 105. That is, the non-conductive adhesive is applied between portions of the upper surface 204 of the driver die 108 surrounding the driver die contact pads 202 and portions of a lower surface (304) of the spacer surrounding the contact pads 302a of the conductive traces 106.

FIG. 3b is a top view of the spacer 105 with conductive traces 106 extending through a wall of the spacer 105. As shown in FIG. 3b, the conductive traces 106 extend through a wall of the spacer 105 to an upper surface 306 of the spacer. It is the upper surface 306 of the spacer 105 that is adhered to the optical element 111 using the second adhesive layer 107b. In this embodiment, when the optical element 111 is mounted to the upper surface 306 of the spacer, contact pads 302b of the conductive traces 106 at the upper surface 306 of the spacer 105 make contact with the interlock feature 113. It will be appreciated that the contact pads 302b of the conductive traces 106 may simply be the ends of the conductive traces 106.

The second adhesive layer 107b may comprise an anisotropic conductive adhesive which conducts in the vertical (z-direction) only. Use of the anisotropic conductive adhesive as the second adhesive layer 107a enables an electrical connection to be made between the contact pads 302b of the conductive traces 106 at the upper surface 306 of the spacer 105 and the interlock feature 113 which is vertically above, and in contact with, the contact pads 302b.

Due to the fact that the anisotropic conductive adhesive conducts in the vertical (z-direction) only, it can be applied such that it is contact with the entire upper surface 306 of the spacer 105 and no electrical shorting between the driver die contact pads 202 will occur.

That is, the anisotropic conductive adhesive may be applied between (i) the contact pads 302b of the conductive traces 106 and contact pads of the interlock feature; and (ii) portions of an upper surface 306 of the spacer surrounding the contact pads 302b of the conductive traces 106 and portions of a lower surface of the optical element surrounding contact pads of the interlock feature.

In other embodiments, the second adhesive layer 107b may comprise an isotropic conductive adhesive which conducts in all directions. In order to prevent electrical shorting between the driver die contact pads 202, the isotropic conductive adhesive is only applied between the contact pads 302b of the conductive traces 106 and contact pads of the interlock feature The isotropic conductive adhesive enables an electrical connection to be made between the contact pads 302b of the conductive traces 106 at the upper surface 306 of the spacer 105 and the interlock feature 113 which is vertically above, and in contact with, the contact pads 302b.

In these embodiments, a non-conductive adhesive may be used for the remaining areas between the upper surface 306 of the spacer 105 and the lower surface of the optical element 111. That is, the non-conductive adhesive is applied between portions of the upper surface 306 of the spacer 105 surrounding the contact pads 302b of the conductive traces 106 and portions of a lower surface of the optical element 111 surrounding contact pads of the interlock feature 113.

Figure 4:
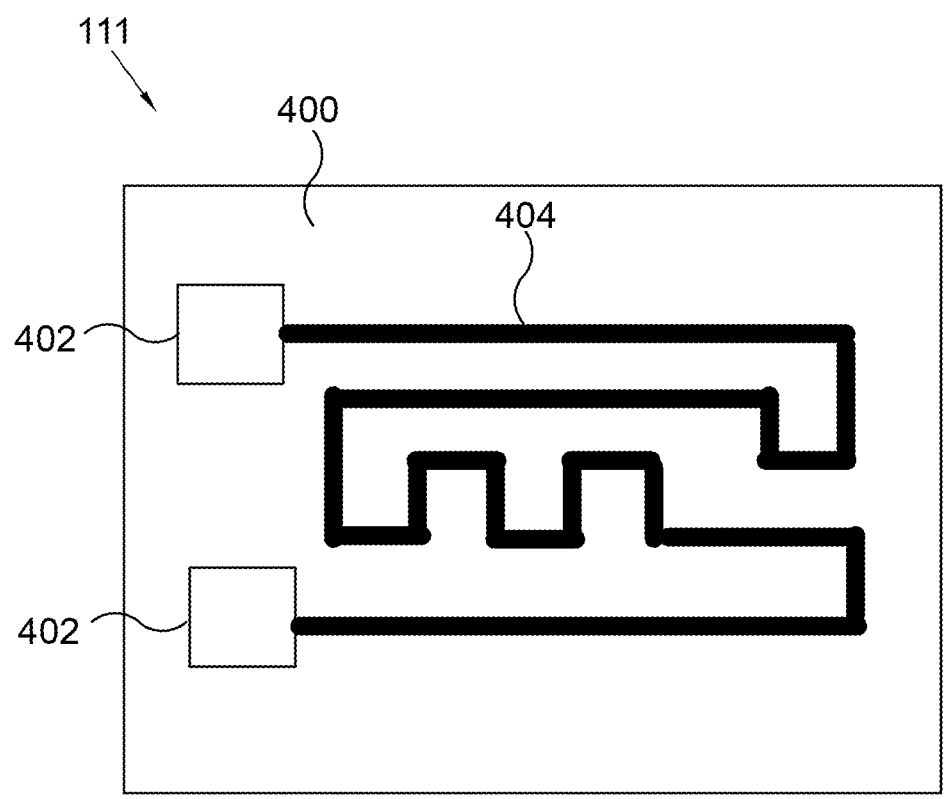
FIG. 4 shows a bottom view of an optical element.

FIG. 4 shows an example of a lower surface 400 of the optical element 111 having an interlock feature 113 formed thereon. The interlock feature 113 comprises a conductive track 404 which may comprise, for example, indium tin oxide, chromium oxide, or any other suitable electrically conductive material. The conductive track 404 extends between contact pads 402 of the interlock feature 113. It will be appreciated that the contact pads 402 of the interlock feature 113 may simply be the ends of the conductive track 404. When the optical element 111 is mounted to the upper surface 306 of the spacer, contact pads 302b of the conductive traces 106 at the upper surface 306 of the spacer 105 make contact with the contact pads 402 of the interlock feature 113

Whilst embodiments have been described above with reference to the conductive traces 106 extend through a wall of the spacer 105, in other implementations the conductive traces 106 may be mounted on an inner surface of a wall of the spacer 105 (such that the conductive traces 106 are surrounded by air in the cavity 109) or an outer surface of a wall of the spacer 105 (such that the conductive traces 106 may be surrounded by the encapculant material 116). In these other implementations, use of a conductive adhesive for the first conductive layer 107a is not required because the electrical connection between the conductive traces 106 and driver die contact pads 202 may be made by the ends of the conductive traces 106 abutting and making contact with suitably positioned driver die contact pads 202. Similarly, in these other implementations, use of a conductive adhesive for the second conductive layer 107b is not required because the electrical connection between the conductive traces 106 and contact pads 402 of the interlock feature 113 may be made by the ends of the conductive traces 106 abutting and making contact with suitably positioned contact pads 402 of the interlock feature 113

Figure 5:
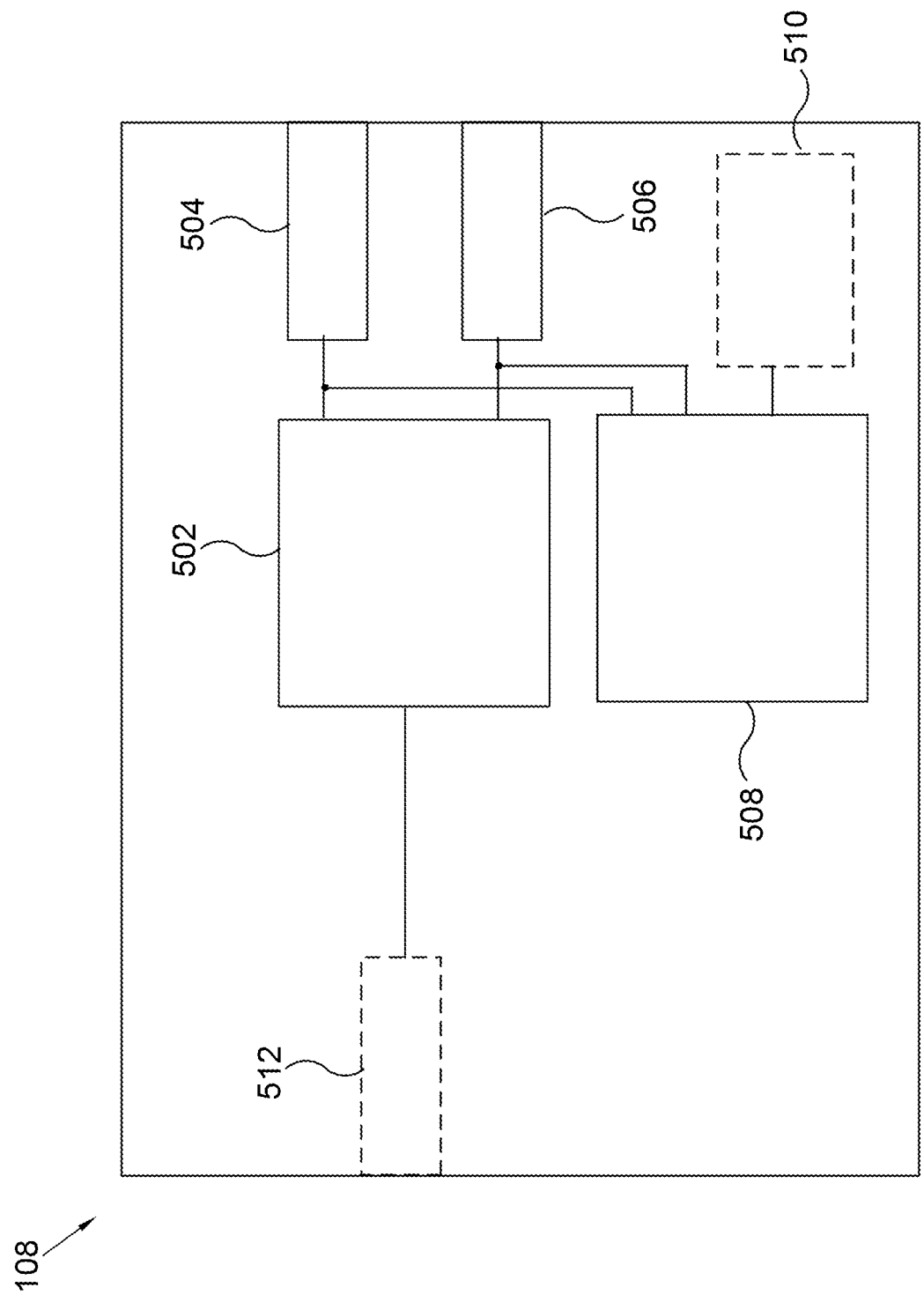
FIG. 5 illustrates a schematic block diagram of a driver die.

FIG. 5 illustrates a simplified schematic block diagram of the driver die 108.

The driver die 108 comprises optical emitter driver circuitry 502 and fault detection circuitry 508.

The optical emitter driver circuitry 502 drives the optical emitter 102 with one or more electrical signals such as one or more electrical currents causing the optical emitter 102 to emit light.

An optical sensor die communicates with the optical emitter driver circuitry 502 of the driver die 108 to trigger the emission of light from the optical emitter 102. The optical sensor die triggers the optical emitter driver circuitry 502 to control the optical emitter 102 to send out a VCSEL pulse. That is, the optical emitter driver circuitry 102 generates ultra-short voltage pulses for the optical emitter 102 (e.g. a VCSEL) using a charge pump.

In embodiments where the optoelectronic module 100 comprises the optical sensor die, an interface 512 enables the optical sensor die to electrically connect to the driver die 108. The interface 512 may comprise one or more contact pads for connecting to contact pads on the optical sensor die (e.g. via wire bonds).

The driver die 108 comprises an interface 504 which enables the driver die 108 to electrically connect to the optical emitter 102. The interface 504 may comprise one or more contact pads for connecting to contact pads on the optical emitter 102 (e.g. via wire bonds 104).

The driver die 108 may additionally comprise an interface 506.

The interface 506 enables the optical emitter driver circuitry 502 to electrically connect to the substrate 114. The interface 506 may comprise one or more contact pads for connecting to contact pads on the substrate 114 (e.g. via wire bonds). In embodiments where the optical sensor die is external to the optoelectronic module 100, the interface 412 enables the optical sensor die to communicate with the optical emitter driver circuitry 402.

The fault detection circuitry 508 is coupled to the interlock feature 113 via the conductive traces 106. The fault detection circuitry 508 is also coupled to the interface 504 and/or the interface 506. The interface 504 enables the fault detection circuitry 508 to electrically connect to the optical emitter 102. The interface 412 enables the fault detection circuitry 508 to electrically connect to the substrate 114 for transmission of an alert to a remote device.

Electrical current is supplied to the interlock feature 113. The optical emitter driver circuitry 502 and/or the fault detection circuitry 508 may supply electrical current to the interlock feature 113.

The fault detection circuitry 508 monitors an electrical parameter associated with the interlock feature 113. For example, the fault detection circuitry 508 may be configured to monitor a resistance and/or capacitance of the interlock feature 113. The fault detection circuitry 508 may be configured, for example, to determine whether the electrical parameter has fallen outside of a pre-determined range, which may indicate that the interlock feature has become damaged and/or disconnected, and therefore that the integrity of one or more components of the optoelectronic module 100 has become compromised. Alternatively, or in addition, the fault detection circuitry 508 may be configured to detect an interruption in electrical conduction through the interlock feature 113. The fault detection circuitry 508 may be further configured to transmit an alert to a user via interface 506 to inform the user that the optoelectronic module 100 may be unsafe. Alternatively, or in addition, the fault detection circuitry 508 may be coupled to the optical emitter 102 via interface 504 and the fault detection circuitry 508 may be configured to transmit a control signal to the optical emitter 102. The control signal may, for example, direct the optical emitter 102 to turn off or otherwise regulate (e.g. reduce) its optical power output to a safe level. The interlock feature 113 therefore serves to prevent accidental harm to a person that may otherwise be caused by direct exposure to high power radiation emission.

As shown in FIG. 5, the driver die 108 may comprise one or more optical detectors 510 coupled to the fault detection circuitry 508.

The optical detectors 510 are photosensitive elements each of which is operable to produce a signal in response to a received dose of radiation (for example visible or infrared light). That is, the optical detectors 510 convert received radiation (for example visible or infrared) into electrical signals. The optical detectors 510 may for example be photodiodes.

Figure 6:
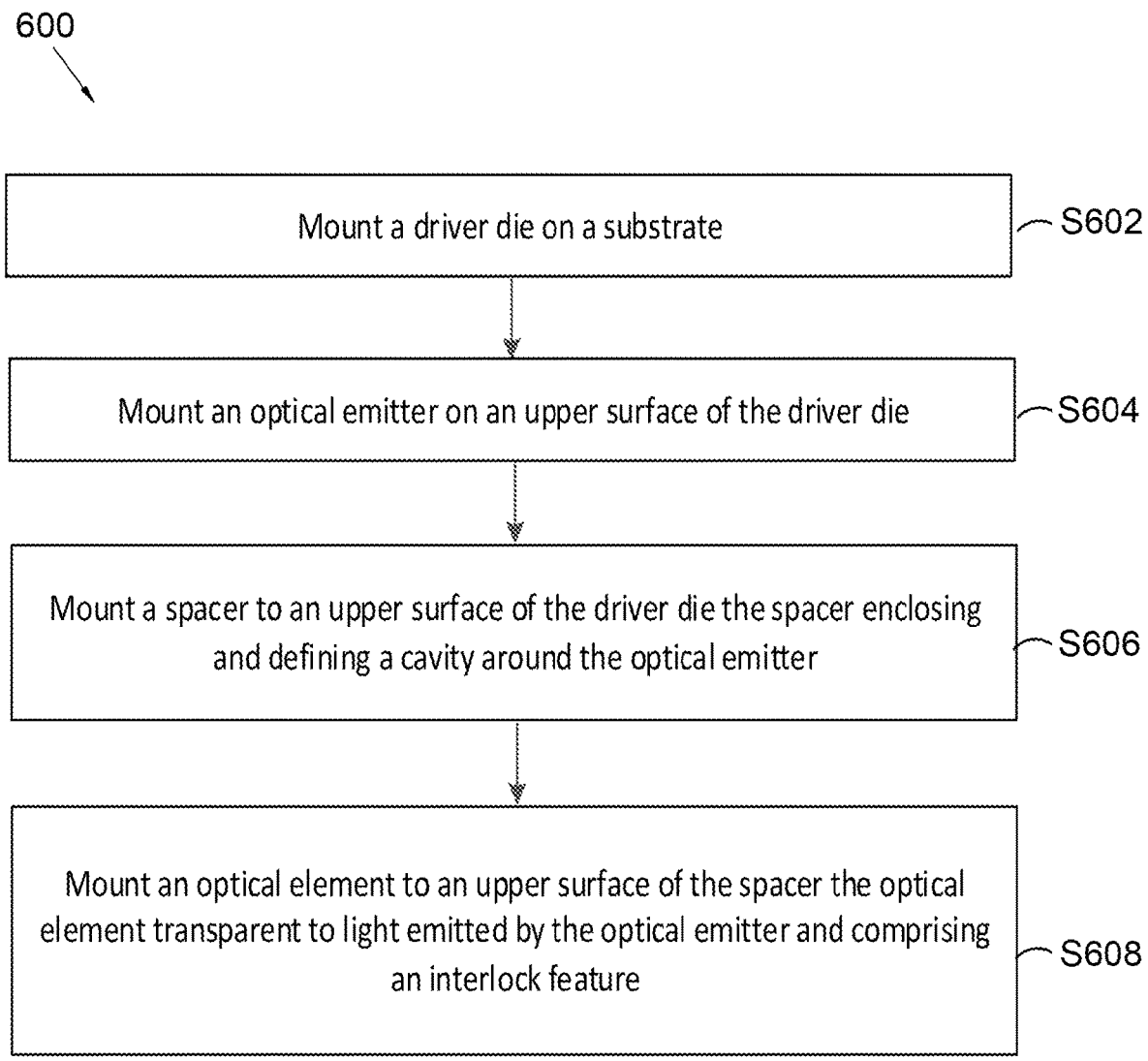
FIG. 6 illustrates a process for manufacturing an optoelectronic module according to the present disclosure.

The optical detectors 510 are arranged such that light incident on the upper surface 204 of the driver die 108 within the cavity 109 is incident on the optical detectors. This enables the fault detection circuitry 508 to measure a change of sensed light that is emitted by the optical emitter 102 and reflected by the lower surface of the optical element 111. The fault detection circuitry 508 may be configured, for example, to determine that the amount of reflection of the light emission has fallen outside of a pre-determined range, which may indicate that the interlock feature has become damaged and/or disconnected, and therefore that the integrity of one or more components of the optoelectronic module 100 has become compromised FIG. 6 illustrates a process 600 for manufacturing an optoelectronic module 100 according to the present disclosure.

At step S602 the driver die 108 is mounted to the substrate 114. As noted above, various different methods may be used for mounting the driver die 108 to the substrate 114.

If contact pads are provided on the backside of the driver die 108 in positions corresponding to contact pads on the upper surface of the substrate 1114, the mounting of the driver die 108 to the upper surface of the substrate 114 may electrically connect the driver die 108 to the substrate 114. Alternatively, the driver die 108 may be electrically connected to the substrate 114 using one or more wire bonds 102.

At step S604, the optical emitter 102 is mounted to the upper surface of the driver die 108. As noted above, various different methods may be used for mounting the optical emitter 102 to the driver die 108.

If contact pads are provided on the backside of the optical emitter 102 in positions corresponding to contact pads on the upper surface of the driver die 108, the mounting of the optical emitter 102 to the upper surface of the driver die 108 performed at step S604 may electrically connect the driver die 108 to the optical emitter 102. Alternatively, the optical emitter 102 may be electrically connected to the driver die 108 using one or more wire bonds 104.

At step S606, the spacer 105 is mounted to the upper surface of the driver die 108 using the first adhesive layer 107a to laterally enclose the optical emitter 102.

At step S608, the optical element 111 is mounted to the spacer 105 using the second adhesive layer 107b. The mounting of the optical element 111 to the spacer 105 results in the interlock feature 113 coming into contact and thereby forming an electrical connection to the conductive traces 106 supported by the spacer.

After step S608, the spacer 105 and the optical element 111 may be laterally encapsulated with the encapsulant material 116 (e.g. the encapsulant material 116 covers sidewalls of the optical stack 102).

As noted above, the encapsulant material 116 may laterally encapsulate the driver die 108 (e.g. cover sidewalls of the driver die 108). In embodiments where the wire bonds 110 are used, the encapsulant material 116 encapsulates the wire bonds 110.

The encapsulant material 116 may be applied by a film assisted transfer molding (FAM) process after which the encapsulant material 116 is cured.

Whilst steps of the process 600 are described in a particular order, embodiments of the present disclosure are not limited to the steps of the process 600 being performed in the order described and the steps of the process 600 may be performed in an alternative order.

Figure 7:
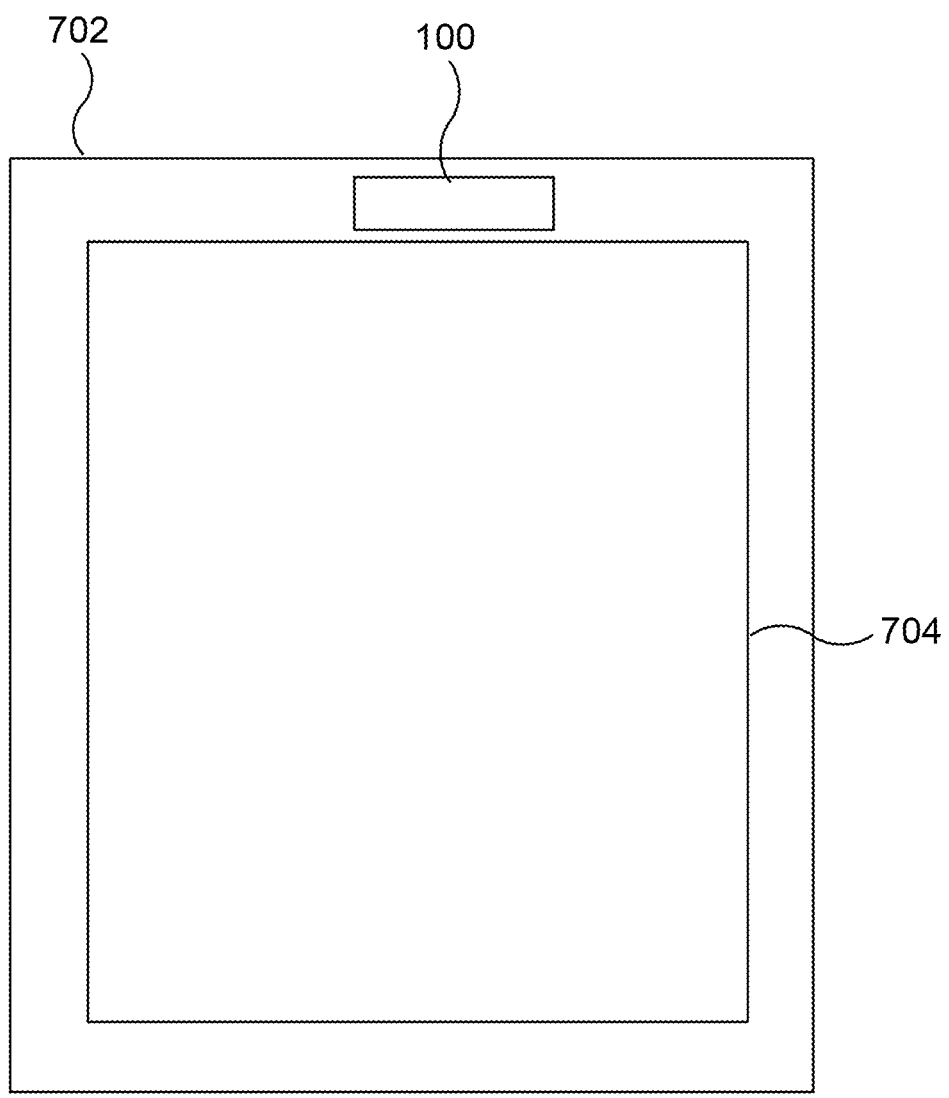
FIG. 7 illustrates a computing device comprising the optoelectronic module described herein.

FIG. 7 illustrates a computing device 702 comprising the optoelectronic module 100 according to any of the embodiments described herein. The computing device 702 shown in FIG. 7 is a mobile phone with a display 704, however it will be appreciated that an apparatus according to embodiments of the present disclosure may be incorporated into other types of computing device (whether mobile or not) e.g. a tablet device, a laptop computer, a gaming device. For example, the computing device 702 may be a wearable device (e.g. a smartwatch).

The optoelectronic module 100 can be utilised in a number of different applications including laser detection auto focus (LDAF), 3D imaging and presence detection.

The skilled person will understand that in the preceding description and appended claims, positional terms such as 'above', 'along', 'side', etc. are made with reference to conceptual illustrations, such as those shown in the appended drawings. These terms are used for ease of reference but are not intended to be of limiting nature. These terms are therefore to be understood as referring to an object when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in any embodiments, whether alone or in any appropriate combination with any other feature disclosed or illustrated herein.

LIST OF REFERENCE NUMERALS 100 optoelectronic module
102 optical emitter
104 wire bond
105 spacer
106 conductive traces
107a adhesive layer
107b adhesive layer
108 driver die
110 wire bond
111 optical element
113 interlock feature
114 substrate
116 encapsulant material
202 contact pads
204 upper surface of the driver die
302a/b contact pads of conductive traces
304 lower surface of the spacer
306 upper surface of the spacer
400 lower surface of the optical element
402 contact pads
404 conductive track
502 optical emitter driver circuitry
504 interface
506 interface
508 fault detection circuitry
510 optical detectors
512 interface
600 process
S602-S608 process steps
702 computing device
704 display

The invention claimed is:

1. An optoelectronic module comprising:
a driver die mounted on a substrate;
an optical emitter mounted to an upper surface of the driver die;
a spacer mounted to the upper surface of the driver die, the spacer enclosing and defining a cavity around the optical emitter; and
an optical element mounted to an upper surface of the spacer, the optical element being transparent to light emitted by the optical emitter and comprising an interlock feature electrically connected to the driver die.

2. The optoelectronic module of claim 1, wherein the optical emitter is electrically connected to the driver die via one or more further wire bonds.

3. The optoelectronic module of claim 1, wherein the optical element comprises at least one of a diffuser and a micro lens array.

4. The optoelectronic module of claim 1, wherein the interlock feature is disposed on a surface of the optical element.

5. The optoelectronic module of claim 1, wherein the interlock feature comprises a conductive track extending between contact pads of the interlock feature.

6. The optoelectronic module of claim 1, further comprising an optical sensor die mounted on an upper surface of the driver die, the optical sensor die comprising at least one optical detector.

7. The optoelectronic module of claim 1, further comprising an encapsulant material that laterally encapsulates the optical element and the spacer.

8. The optoelectronic module of claim 7, wherein the driver die is electrically connected to the substrate via one or more wire bonds and the encapsulant material encapsulates the one or more wire bonds.

9. The optoelectronic module of claim 7, wherein the encapsulant material covers an upper surface of a portion of the substrate.

10. The optoelectronic module of claim 7, wherein the encapsulant material laterally encapsulates the driver die and covers a portion of the upper surface of the driver die.

11. The optoelectronic module of claim 1, wherein the driver die comprises fault detection circuitry configured to monitor an electrical parameter associated with the interlock feature.

12. The optoelectronic module of claim 11, wherein the driver die comprises at least one optical detector coupled to the fault detection circuitry.

13. The optoelectronic module of claim 1, further comprising conductive traces supported by the spacer to make an electrical connection between the driver die and the interlock feature.

14. The optoelectronic module of claim 13, wherein the conductive traces extend through a wall of the spacer, and the spacer is mounted to the upper surface of the driver die using a first conductive adhesive layer, and the optical element is mounted to an upper surface of the spacer using a second conductive adhesive layer.

15. The optoelectronic module of claim 14, wherein the conductive traces extend from a first set of contact pads of the spacer to a second set of contact pads of the spacer through the wall of the spacer, the first set of contact pads in connection with the first conductive adhesive layer and the second set of contact pads in connection with the second conductive adhesive layer.

16. The optoelectronic module of claim 15, wherein the upper surface of the driver die comprises driver die contact pads, wherein the first conductive adhesive layer comprises an anisotropic conductive adhesive that is between (i) the driver die contact pads and the first set of contact pads of the spacer; and (ii) portions of the upper surface of the driver die surrounding the driver die contact pads and portions of a lower surface of the spacer surrounding the first set of contact pads.

17. The optoelectronic module of claim 15, wherein an upper surface of the driver die comprises driver die contact pads, wherein the first conductive adhesive layer comprises an isotropic conductive adhesive that is between the driver die contact pads and the first set of contact pads of the spacer; and a non-conductive adhesive that is between portions of the upper surface of the driver die surrounding the driver die contact pads and portions of a lower surface of the spacer surrounding the first set of contact pads.

18. The optoelectronic module of claim 15, wherein the second conductive adhesive layer comprises an anisotropic conductive adhesive that is between (i) the second set of contact pads of the spacer and contact pads of the interlock feature; and (ii) portions of an upper surface of the spacer surrounding the second set of contact pads and portions of a lower surface of the optical element surrounding the contact pads of the interlock feature.

19. The optoelectronic module of claim 15, wherein the second conductive adhesive layer comprises an isotropic conductive adhesive that is between the second set of contact pads of the spacer and contact pads of the interlock feature; and a non-conductive adhesive that is between portions of an upper surface of the spacer surrounding the second set of contact pads and portions of a lower surface of the optical element surrounding the contact pads of the interlock feature.

20. A method of manufacturing an optoelectronic module, the method comprising:
  mounting a driver die on a substrate;
  mounting an optical emitter to an upper surface of the driver die;
  mounting a spacer to the upper surface of the driver die, the spacer enclosing and defining a cavity around the optical emitter; and
  mounting an optical element to an upper surface of the driver die, the optical element being transparent to light emitted by the optical emitter and comprising an interlock feature for electrical connection to the driver die.

* * * * *